United States Patent
Kim et al.

(10) Patent No.: US 8,357,593 B2
(45) Date of Patent: Jan. 22, 2013

(54) METHODS OF REMOVING WATER FROM SEMICONDUCTOR SUBSTRATES AND METHODS OF DEPOSITING ATOMIC LAYERS USING THE SAME

(75) Inventors: Ki-chul Kim, Seongnam-si (KR); Youn-soo Kim, Yongin-si (KR); Ki-vin Im, Seongnam-si (KR); Cha-young Yoo, Suwon-si (KR); Jong-cheol Lee, Seoul (KR); Ki-yeon Park, Seoul (KR); Hoon-sang Choi, Seoul (KR); Se-hoon Oh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 457 days.

(21) Appl. No.: 12/688,044

(22) Filed: Jan. 15, 2010

(65) Prior Publication Data

US 2010/0190320 A1  Jul. 29, 2010

(30) Foreign Application Priority Data

Jan. 29, 2009  (KR) ........................ 10-2009-0006985

(51) Int. Cl.
*H01L 21/322* (2006.01)

(52) U.S. Cl. ................................ 438/476; 257/E21.211
(58) Field of Classification Search .................. 438/476; 257/E21.211

See application file for complete search history.

(56) References Cited

U.S. PATENT DOCUMENTS 5,932,493 A * 8/1999 Akatsu et al. ................. 438/745
8,093,159 B2 * 1/2012 Mizuno et al. ................ 438/770

FOREIGN PATENT DOCUMENTS

| JP | 2005-101529 | 4/2005 |
| KR | 1020050005726 A | 1/2005 |
| KR | 1020050007496 A | 1/2005 |

* cited by examiner

*Primary Examiner* — Trung Q Dang
(74) *Attorney, Agent, or Firm* — Myers Bigel Sibley & Sajovec, PA

(57) ABSTRACT

Provided are methods of removing water adsorbed or bonded to a surface of a semiconductor substrate, and methods of depositing an atomic layer using the method of removing water described herein. The method of removing water includes applying a chemical solvent to the surface of a semiconductor substrate, and removing the chemical solvent from the surface of the semiconductor substrate.

10 Claims, 7 Drawing Sheets

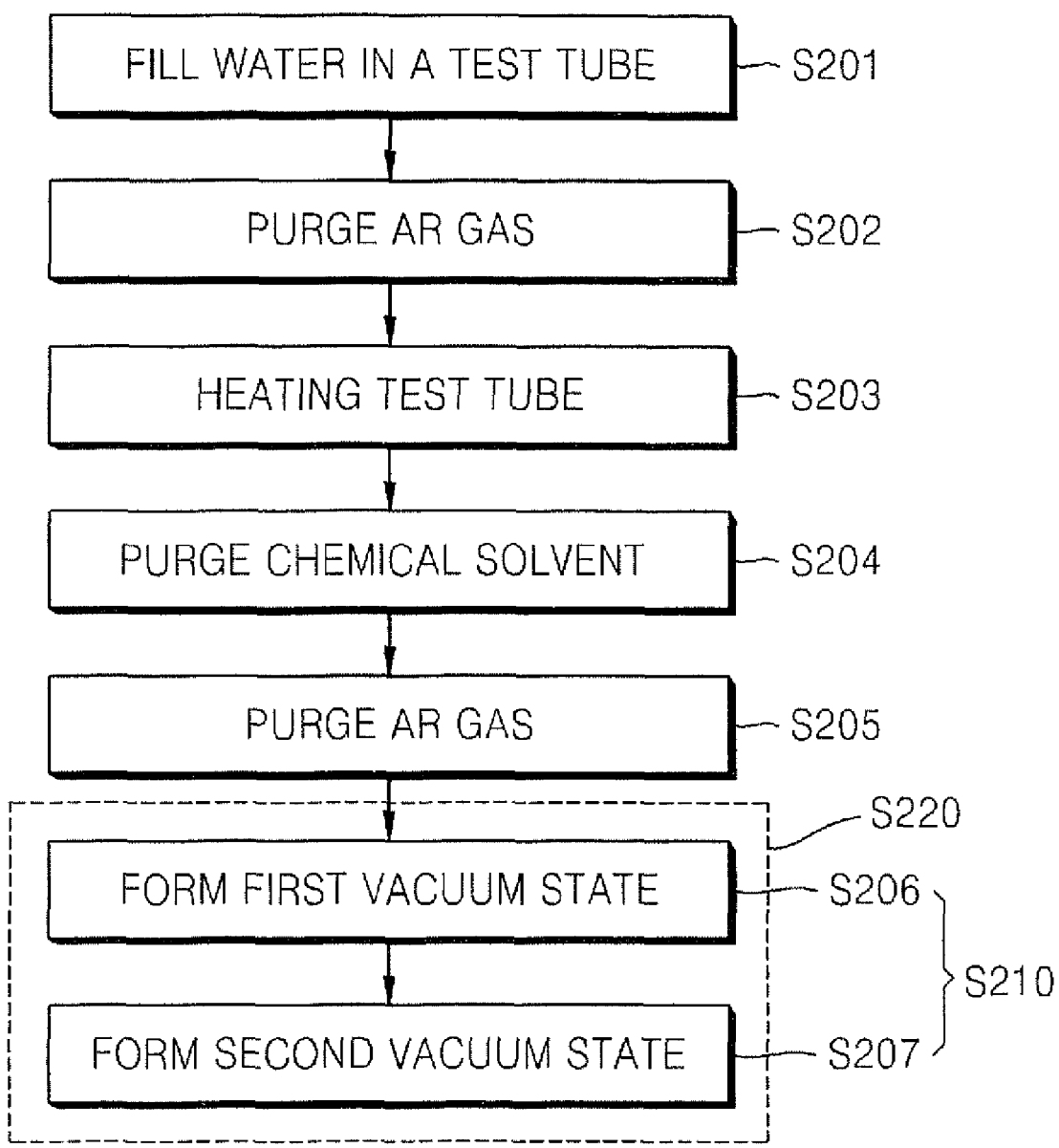

US 8,357,593 B2

METHODS OF REMOVING WATER FROM SEMICONDUCTOR SUBSTRATES AND METHODS OF DEPOSITING ATOMIC LAYERS USING THE SAME

CROSS-REFERENCE TO RELATED APPLICATIONS

This application claims the benefit of Korean Patent Application No. 10-2009-0006985, filed on Jan. 29, 2009, in the Korean Intellectual Property Office, the disclosure of which is incorporated herein by reference in its entirety.

FIELD OF THE INVENTIVE CONCEPT

Aspects of the inventive concept relate to methods of removing water from semiconductor substrates and methods of depositing atomic layers using the same, and more particularly, to methods of removing water from a semiconductor substrate during a semiconductor manufacturing process and methods of depositing atomic layers by removing water from a semiconductor substrate.

BACKGROUND

During semiconductor manufacturing processes, water may be used on a semiconductor substrate, and after using the water on the semiconductor substrate, the water is generally removed from the semiconductor substrate by a purging process. If water is not sufficiently removed from the semiconductor substrate, negative effects may be reflected in the semiconductor substrate, and thus, the performance of a semiconductor device may be degraded and/or negatively impacted.

SUMMARY

Aspects of the inventive concept provide methods of removing water from a surface of a semiconductor substrate.

Aspects of the inventive concept also provide methods of depositing an atomic layer having a high performance by sufficiently removing water from a semiconductor substrate.

According to some aspects of the inventive concept, there is provided a method of removing water adsorbed and/or bonded to a surface of a semiconductor substrate, the method includes applying a chemical solvent onto the surface of the semiconductor substrate to remove water from the surface of the semiconductor substrate; and removing the chemical solvent from the surface of the semiconductor substrate.

The chemical solvent may be at least one selected from the group consisting of $R^1OH$, $R^2OR^3$, $R^4COR^5$, and $NR^6R^7R^8$, where $R^1$, $R^2$, and $R^4$ are respectively independently at least one selected from the group consisting of a C1-C6 alkyl group, a C6-C8 aryl group, a C2-C6 vinyl group, a C2-C6 alkenyl group, a C1-C6 haloalkyl group, a C1-C6 alkoxy group, a C2-C6 alkoxyalkyl group, and an amino group; $R^3$, $R^5$, $R^6$, $R^7$, and $R^8$ are respectively independently at least one selected from the group consisting of hydrogen, a halogen group, a C1-C6 alkyl group, a C6-C8 aryl group, a C2-C6 vinyl group, a C2-C6 alkenyl group, a C1-C6 haloalkyl group, a C1-C6 alkoxy group, a C2-C6 alkoxyalkyl group, and an amino group, and any two of $R^2$ and $R^3$, $R^4$ and $R^5$, or $R^6$ through $R^8$ form a ring by being connected to each other.

The application of the chemical solvent to the surface of the semiconductor substrate may be performed at a temperature in a range from about 80 to about 300° C. The method may further include purging a gas before and/or after applying the chemical solvent to the surface of the semiconductor substrate. The purged gas may be at least one selected from the group consisting of He, Ne, Ar, and $N_2$.

The removal of the chemical solvent may be performed at an absolute pressure that is lower than atmospheric pressure. The attractive force between the chemical solvent and the water may be greater than the bonding force or the adsorption force between the semiconductor substrate and water.

The application of the chemical solvent onto the surface of the semiconductor substrate may be performed at an absolute pressure that is lower than atmospheric pressure.

The chemical solvent may be at least one selected from the group consisting of 1-butanol, 1-pentanol, ethanol, propanol, N-methyl-2-pyrrolidone (NMP), dimethylketone, dimethylether, trimethylamine, ethylene oxide, 2-butanal, diisobutylamine, and pyrrolidine.

According to a further aspect of the inventive concept, there is provided a method of depositing an atomic layer including: supplying water to a surface of a semiconductor substrate as an oxidant for an atomic layer deposition (ALD) process; applying a chemical solvent to the surface of the semiconductor substrate; and removing the chemical solvent from the surface of the semiconductor substrate.

BRIEF DESCRIPTION OF THE DRAWINGS

Exemplary embodiments of the inventive concept will be more clearly understood from the following detailed description taken in conjunction with the accompanying drawings in which:

FIGS. 4A and 4B respectively are flowcharts showing methods of testing a water removing effect, according to a comparative example and an embodiment of the inventive concept.

DETAILED DESCRIPTION

Figure 1:
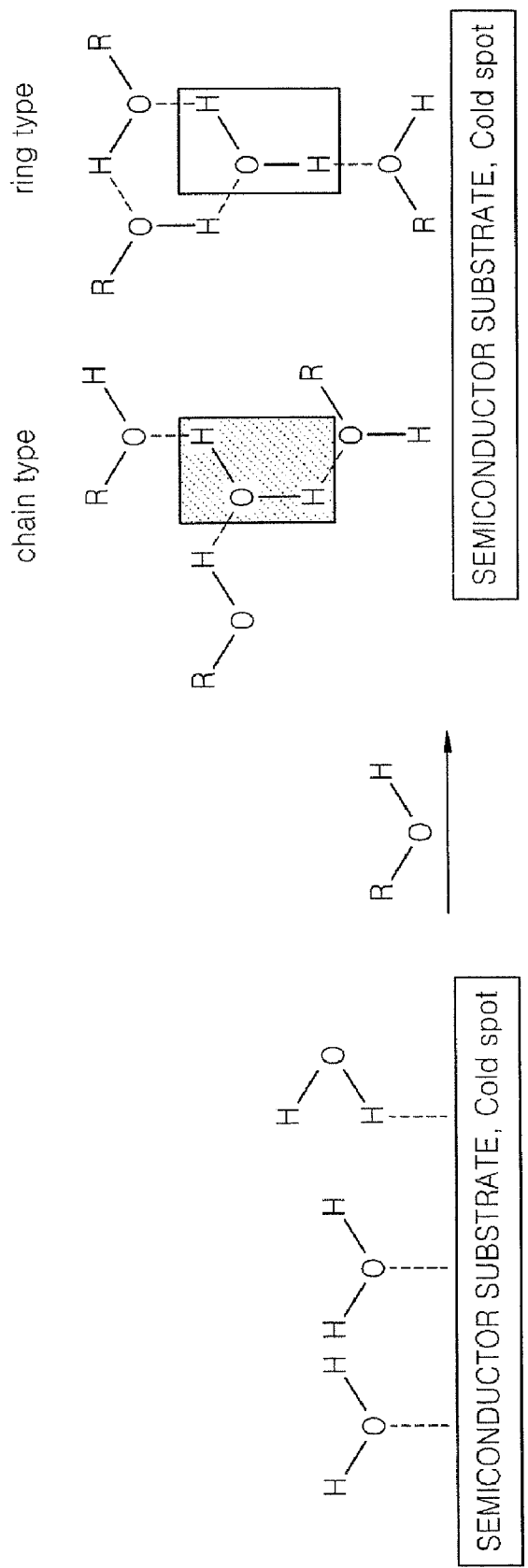
FIG. 1 is a schematic diagram showing a principle of removing water, according to an embodiment of the inventive concept.

The inventive concept will be described more fully with reference to the accompanying drawings, in which exemplary embodiments of the inventive concept are shown. This inventive concept may, however, be embodied in many different forms and should not be construed as limited to the exemplary embodiments set forth herein. Rather, these embodiments are provided so that this disclosure will be thorough and complete, and will fully convey the scope of the inventive concept to those of ordinary skill in the art.

The terminology used in the description of the inventive concept herein is for the purpose of describing particular embodiments only and is not intended to be limiting of the inventive concept. As used in the description of the embodiments of the inventive concept and the appended claims, the singular forms "a", "an" and "the" are intended to include the plural forms as well, unless the context clearly indicates otherwise. Also, as used herein, "and/or" refers to and encompasses any and all possible combinations of one or more of the associated listed items.

Unless otherwise defined, all terms, including technical and scientific terms used in this description, have the same meaning as commonly understood by one of ordinary skill in the art to which the inventive concept belongs.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present inventive concept.

According to an embodiment of the inventive concept, a method of removing water, $H_2O$, adsorbed and/or bonded on a substrate, for example, a semiconductor substrate, is provided, wherein the method includes: applying a chemical solvent to a surface of the substrate; and removing the chemical solvent from the surface of the substrate.

In particular embodiments of the inventive concept, the chemical solvent, although it may also be expressed as a "solvent", is defined to include an instance of using a solvent to dissolve a solute and an instance of using a solvent as a dispersing agent to disperse a material. Also, the chemical solvent may be used in a liquid state or a vapor state according to temperature and pressure conditions as understood by one of ordinary skill in the art. Further, the solvent is applied to a selected surface such that the solvent can be applied on, onto, to, etc. in a manner to be in contact with the surface as understood by one of ordinary skill in the art.

Water may be used for various purposes such as an oxidant in a semiconductor manufacturing process; in particular, in an atomic layer deposition (ALD) process. As described above, if water is not sufficiently removed from a semiconductor substrate after its use, negative effects may occur on the semiconductor substrate, and as a result, the performance of a semiconductor device may be adversely affected.

Water may be adsorbed or bonded on a surface of the semiconductor substrate. If water is adsorbed on the surface of the semiconductor substrate, the water may be in a physisorption state or in a chemisorption state. If water is bonded on the surface of the semiconductor substrate, the water may form hydrogen bonds with the semiconductor substrate. As described above, the adsorption and/or bonding of water on the semiconductor substrate may result from using water as an oxidant in an ALD process. In other words, the process of supplying water onto a semiconductor substrate as an oxidant may further be included prior to applying a chemical solvent to the surface of the semiconductor substrate. Water may refer to $H_2O$, tap water, deionized water, etc.

The chemical solvent to be applied to the surface of the semiconductor substrate may be at least one selected from the group consisting of $R^1OH$, $R^2OR^3$, $R^4COR^5$, and $NR^6R^7R^8$. $R^1$, $R^2$, and $R^4$ may be respectively independently at least one selected from the group consisting of a C1-C6 alkyl group, a C6-C8 aryl group, a C2-C6 vinyl group, a C2-C6 alkenyl group, a C1-C6 haloalkyl group, a C1-C6 alkoxy group, a C2-C6 alkoxyalkyl group, and an amino group. $R^3$, $R^5$, $R^6$, $R^7$, and $R^8$ may be respectively independently at least one selected from the group consisting of hydrogen, a halogen group, a C1-C6 alkyl group, a C6-C8 aryl group, a C2-C6 vinyl group, a C2-C6 alkenyl group, a C1-C6 haloalkyl group, a C1-C6 alkoxy group, a C2-C6 alkoxyalkyl group, and an amino group. Any two of $R^2$ and $R^3$, $R^4$ and $R^5$, or $R^6$ through $R^8$ may form a ring by being connected to each other.

More specifically, the chemical solvent may be an alcohol such as methanol. ethanol, 1-propanol, 2-propanol, 2-methyl-1-propanol, 1-butanol, sec-butanol, tert-butanol, iso butanol, 1-pentanol, 3-methyl-1-butanol, 2-methyl-1-butanol, 2-methyl-2-butanol, 2,2-dimethyl-1-propanol, 3-pentanol, 2-pentanol, 3-methyl-2-butanol, 2-methyl-2-butanol. cyclohexanol, dicyclohexanol, 2-methoxyethanol, 2-ethoxyethanol, 2-(methoxymethoxy)ethanol, 2-isopropoxyethanol, 1-methoxy-2-propanol, or 1-ethoxy-2-propanol.

Also, the chemical solvent may be an ether-based or an epoxy-based material such as dimethyl ether, methyl ethyl ether, diethyl ether, diisopropyl ether, butyl ether, bis(2-methoxyethyl)ether, bis(2-ethoxyethyl)ether, isopentyl ether, divinyl ether, ethylene oxide, tetrahydrofuran, propylene oxide, or phenyl ether.

Further, the chemical solvent may be an aldehyde-based material such as ethanal that is unsubstituted or substituted with a halogen atom, propanal that is unsubstituted or substituted with a halogen atom, butanal that is unsubstituted or substituted with a halogen atom, or 2-butanal that is unsubstituted or substituted with a halogen atom; or a ketone-based material such as cyclohexanone that is unsubstituted or substituted with a halogen atom, propanone that is unsubstituted or substituted with a halogen atom, butanone that is unsubstituted or substituted with a halogen atom, 2-pentanone that is unsubstituted or substituted with a halogen atom, acetophenone that is unsubstituted or substituted with a halogen atom, or benzophenone that is unsubstituted or substituted with a halogen atom.

The chemical solvent may be an amine-based material such as ammonia, methyl amine, dimethylamine, trimethylamine, propylamine, diethylamine, dimethylethylamine, methylethylpropylamine, triethylamine, tri-n-propylamine, triisopropylamine, n-butylamine, isobutylamine, sec-butylamine, tert-butylamine, pentylamine, diisopropylamine, di-n-butylamine, diisobutylamine, di-sec-butylamine, dipentylamine, tri-n-butylamine, tri-isobutylamine, tri-sec-butylamine, tripentylamine, tricyclopentylamine, trihexylamine, cyclopentylamine, dicyclopentylamine, cyclohexylamine, pyrrolidine, pyridine, piperidine, or aniline.

The chemical solvent may be selected such that a bonding force between the chemical solvent and water is stronger than the bonding force between the semiconductor substrate and water as could be determined by one of ordinary skill in the art.

The chemical solvent may be applied to the surface of the semiconductor substrate, for example, by spin coating the chemical solvent on the surface of the semiconductor substrate, by immersing the semiconductor substrate in the chemical solvent, or by forming a bulk flow of the chemical solvent around the surface of the semiconductor substrate. However, the methods of applying the chemical solvent to the surface of the semiconductor substrate are not limited thereto. Optionally, the chemical solvent may be applied to the surface of the semiconductor substrate in a vapor state. In this case, an atmosphere formed of a vapor of the chemical solvent may be formed around the surface of the semiconductor substrate.

The surface of the semiconductor substrate may be in contact with the chemical solvent for a period of time, for example, in a range of about 30 seconds to about 10 minutes.

Additionally, application of the chemical solvent to the surface of the semiconductor substrate may be performed at a temperature in a range of about 80° C. to about 300° C. When the chemical solvent contacts the surface of the semiconductor substrate at a high temperature, water that is adsorbed or bonded to the surface of the semiconductor substrate may be removed more readily.

Application of the chemical solvent to the surface of the semiconductor substrate may be performed at an absolute pressure that is lower than atmospheric pressure. The pressure at which the chemical solvent is applied to the surface of the semiconductor substrate may be, for example, about 1 Torr to about 200 Torr. If the pressure is too high, the water-removing effect may be reduced at least due to the increased absolute pressure, and if the pressure is too low, the process is generally uneconomical.

A purge operation for purging a gas may further be included before and/or after application of the chemical solvent to the surface of the semiconductor substrate. The purged gas may be at least one selected from the group consisting of He, Ne, Ar, and $N_2$.

As described above, after applying the chemical solvent to the surface of the semiconductor substrate, the chemical solvent may be removed from the surface of the semiconductor substrate. The chemical solvent may contain the water that had been adsorbed and/or bonded to the semiconductor substrate and was removed from the surface of the semiconductor substrate. When the chemical solvent is applied to the surface of the semiconductor substrate by spin coating, in order to remove the chemical solvent from the surface of the semiconductor substrate, the semiconductor substrate may be continuously rotated for a predetermined time while the supply of the chemical solvent is stopped. When the chemical solvent is applied to the surface of the semiconductor substrate by soaking the semiconductor substrate in the chemical solvent or by forming a bulk flow of the chemical solvent around the surface of the semiconductor substrate, the semiconductor substrate may be taken out of the chemical solvent or the bulk flow of the chemical solvent formed around the surface of the semiconductor substrate may be stopped.

In addition, in order to obtain substantial removal of the chemical solvent from the surface of the semiconductor substrate, the removal may be performed under an absolute pressure that is lower than atmospheric pressure. For example, removal of the chemical solvent may be performed at an absolute pressure in a range of about 0.01 to about 0.8 atm.

Also, a purge process may be further included to remove more thoroughly the chemical solvent from the surface of the semiconductor substrate. An apparatus for reducing the absolute pressure generally involves expensive equipment. As shown by the present inventors, an effect similar to the reduction of absolute pressure of the chemical solvent may be obtained by purging a gas and thereby reducing the partial pressure of the chemical solvent. Thus, the purging operation may be helpful for further removal of the chemical solvent from the semiconductor substrate. The purging gas may be at least one selected from the group consisting of He, Ne, Ar, and $N_2$.

In order to remove more thoroughly the chemical solvent from the surface of the semiconductor substrate, both the removal of the chemical solvent at an absolute pressure that is lower than atmospheric pressure and the purging operation for purging a gas may be performed at the same time or performed sequentially. When the two operations are performed sequentially, the two operations may be at least twice respectively performed sequentially.

Water on the surface of the semiconductor substrate may be removed sufficiently by using the methods described above. Water may be removed according to the principle shown in FIG. 1. However, the present inventive concept is not limited hereto.

Referring to FIG. 1, water molecules may be adsorbed and/or bonded on the surface of the semiconductor substrate. At least one chemical solvent molecule having, for example, a R—OH formula may capture a water molecule, and thus, the water molecule is removed from the surface of the semiconductor substrate since the attractive force between the water molecule and the chemical solvent molecule is stronger than the bonding force or the adsorption force between the water molecule and the semiconductor substrate.

In particular, it is believed that the strong bond between the water molecule and the chemical solvent molecule is derived from a strong hydrogen bond between a hydrogen atom in the water molecule and an oxygen atom or a nitrogen atom in the chemical solvent molecule.

According to an aspect of the inventive concept, a method of removing water may be applied to atomic layer deposition (ALD).

That is, after a metal atom layer is formed on a semiconductor substrate using a precursor of a metal atom to be deposited using an ALD process, water vapor may be supplied to the ALD process as an oxidant. Next, a process of removing water may be performed using the methods described above.

As described above, when water is used in an ALD process, the water may be effectively removed from a semiconductor substrate. Here, the case of using water as an oxidant is described; however, even if water is used for other purposes, the same effect may be obtained.

The configurations and effects of the inventive concept will now be described in detail with reference to embodiments according the inventive concept and comparative examples. However, the embodiments of the inventive concept should not be construed as limited thereto.

Figure 2:
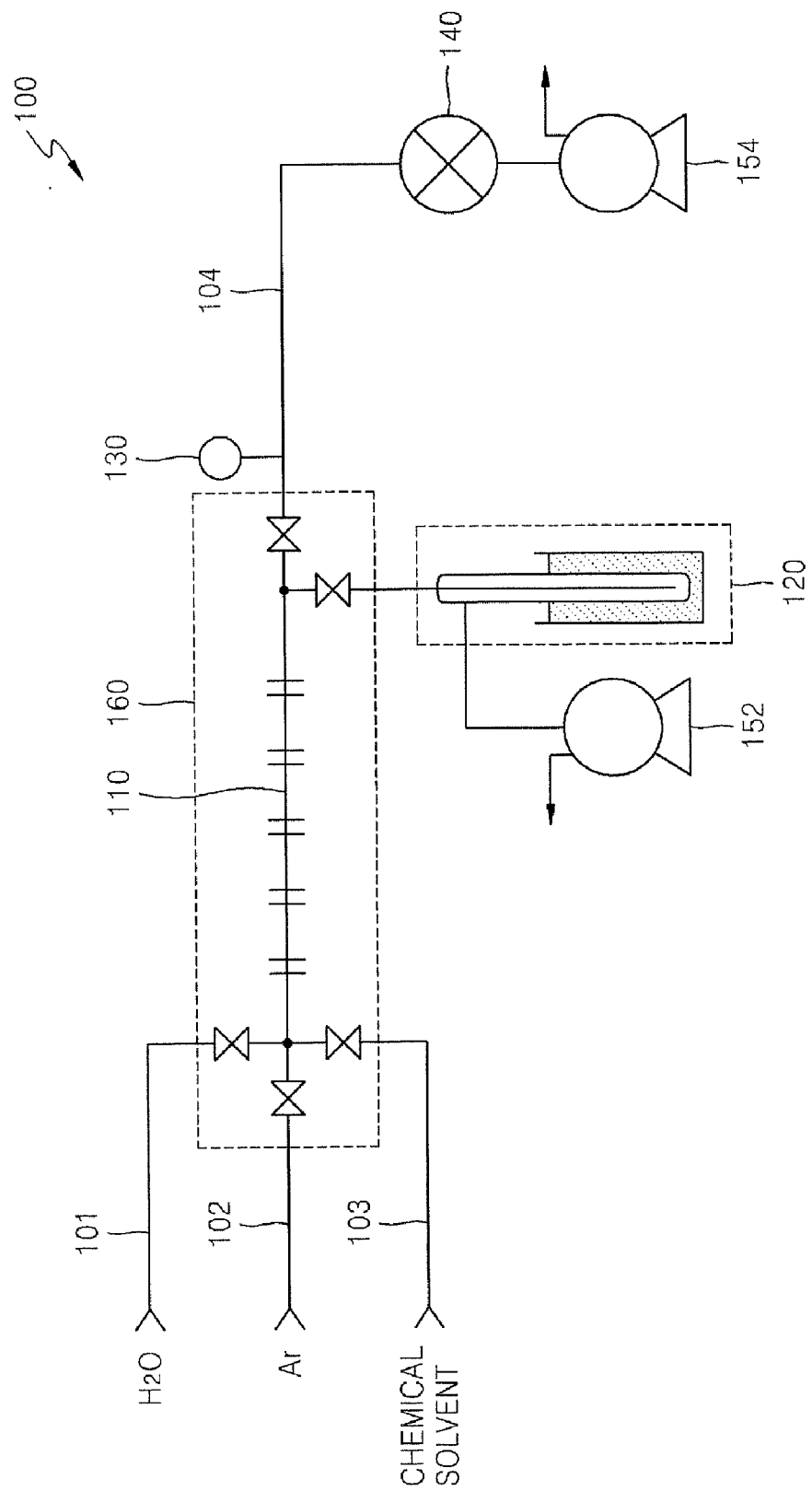
FIG. 2 is a conceptual schematic diagram of an apparatus for testing a water removing effect, according to an embodiment of the inventive concept.
Figure 3:
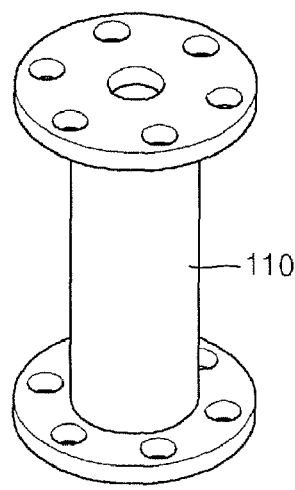
FIG. 3 is a perspective view of a test tube for testing the water removing effect, according to an embodiment of the inventive concept.

In order to examine the method of removing water according to an embodiment of the inventive concept, a test apparatus 100 as shown in FIG. 2 is formed. FIG. 2 is a conceptual schematic diagram of the test apparatus 100 for testing a water removing effect, according to an embodiment of the inventive concept Referring to FIG. 2, a deionized water supply line 101, an argon gas supply line 102, and a chemical solvent supply line 103 are provided on a side of a test tube 110 and are connected to each other via valves that may control flow of fluids. FIG. 3 is a perspective view of the test tube 110 according to an embodiment of the inventive concept. The test tube 110 may be formed of stainless steel, and is formed to identify molecules adsorbed and/or bonded to an inner surface of the test tube 110 when a vacuum test is performed after passing water, an inert gas, and/or a chemical solvent through the test tube 110.

A heating device 160 that may increase the temperature of the inside and/or outside of the test tube 110 and may maintain the temperature of the test tube 110 constant is provided around the test tube 110. A trap unit 120 for removing liquids in the test tube 110 is formed on another side of the test tube 110 and a gas removing line 104 that removes gas in the test tube 110 is formed parallel to the trap unit 120. A first rotary pump 152 is formed on the trap unit 120 to smoothly remove liquids from the test tube 110.

A pressure gauge 130 is provided on the gas removing line 104. A second rotary pump 154 and a turbo-molecular pump (TMP) 140 for forming vacuum states in the gas removing line 104 are connected to an end portion of the gas removing line 104. The gas removing line 104 is primarily vacuumed to a first vacuum state by operating the second rotary pump 154, and is secondarily further vacuumed to a vacuum state higher than the first vacuum state by operating the turbo-molecular pump 140, which is serially connected to the second rotary pump 154.

COMPARATIVE EXAMPLE 1

In order to obtain a reference pressure file, a first vacuum state was formed in the test tube 110 by operating the second rotary pump 154 without applying water or a chemical solvent to an inner surface of the test tube 110. Approximately 4 minutes later from the time when the pressure in the test tube 110 reaches 9 Pa, a second vacuum state was formed in the test tube 110 by operating the TMP 140. In this process, the pressure in the test tube 110 was measured from the point when the pressure in the test tube 110 reaches 9 Pa with the pressure gauge 130.

Figure 5:
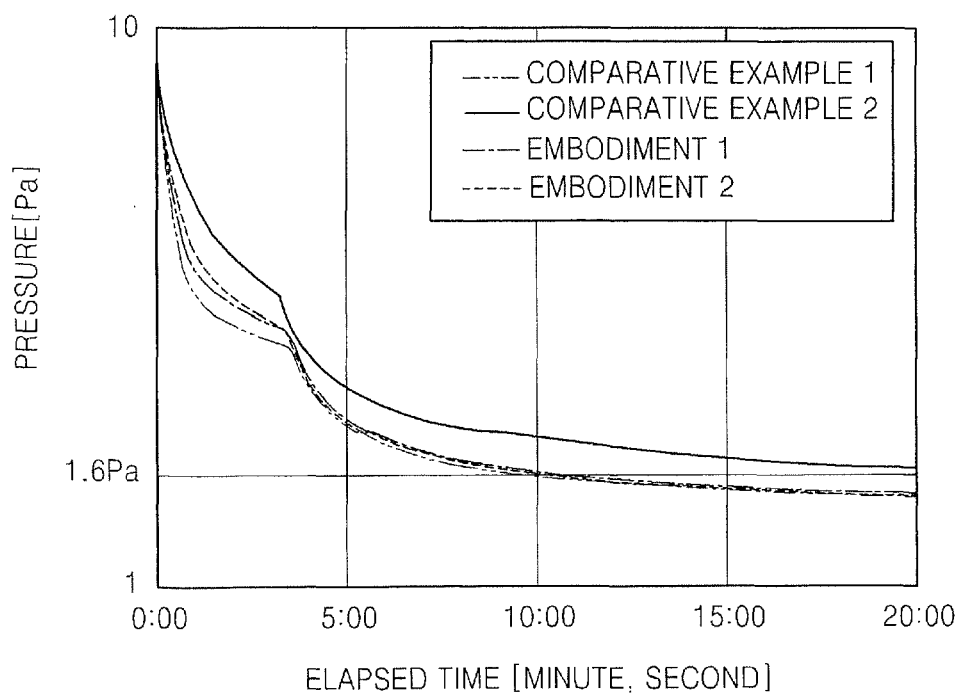
FIGS. 5 through 10 are graphs showing the test results of the water removing effect, according to an embodiment of the inventive concept and a comparative example.

As a result, a reference pressure profile (the lowest line of the lines) as shown in FIG. 5 was obtained.

COMPARATIVE EXAMPLE 2

Figure 4A:
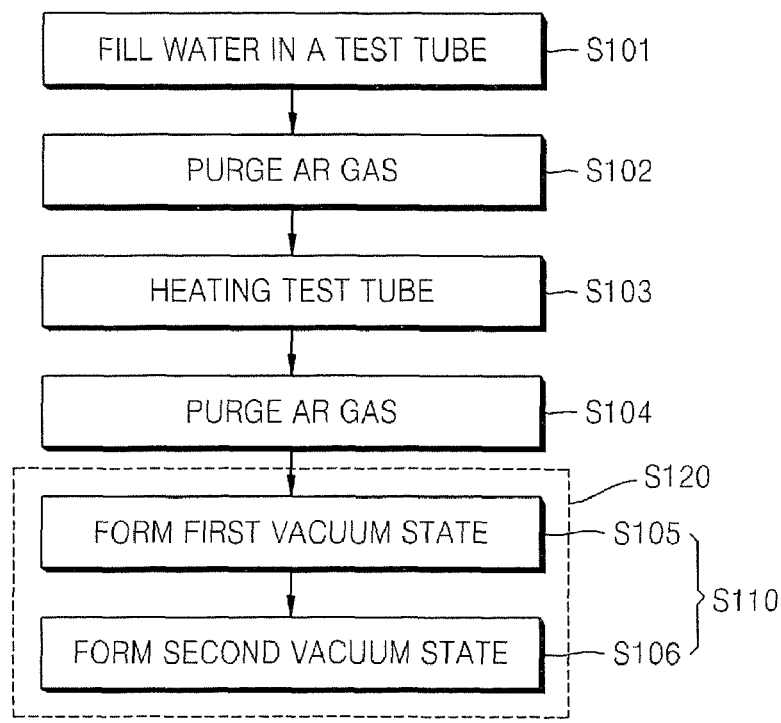

In order to investigate the adsorption or bonding of water on the inner surface of the test tube 110 after passing water through the test tube 110, comparative tests were performed according to the method shown in FIG. 4A.

First, the test tube 110 was filled with water (S101), the water was removed through the trap unit 120, and argon gas, which is an inert gas, was purged in the test tube 110 for 5 seconds (S102). Afterwards, the test tube 110 was heated to 100° C. (S103), and again, argon gas was purged in the test tube 110 for 30 seconds (S104).

Afterwards, a vacuum state was formed in the test tube 110 (S110). The vacuuming of the test tube 110 includes two sub-steps (S105 and S106), that is, the first vacuum state was formed by operating the second rotary pump 154 (S105) and the second vacuum state, which is a vacuum state higher than the first vacuum state, was formed by operating the TMP 140 after a predetermined time period from the first vacuum state (S105) had elapsed. In the process of forming the first and second vacuum states, the pressure in the test tube 110 was measured using the pressure gauge 130 (S120).

As a result, a pressure profile according to time was obtained as shown in FIG. 5. The uppermost line of the lines in FIG. 5 indicates the pressure profile of comparative example 2. More specifically, although the first and second vacuum states were formed, the pressure in the test tube 110 shows a large difference from the reference pressure profile due to the partial pressure of water vapor formed by detaching or separating water molecules from the inner surface of the test tube 110, which had been adsorbed or bonded to the inner surface of the test tube 110.

Therefore, it is observed that a significant amount of water is adsorbed or bonded to the inner surface of the test tube 110, and although an inert gas is purged and a vacuum state is formed, water is not easily removed.

Embodiment 1

FIG. 4B is a flow chart showing a method of testing the water-removing effect according to an embodiment of the inventive concept. Referring to FIG. 4B, first, the test tube 110 was filled with water (S201), the water is removed through the trap unit 120, and argon gas, which is an inert gas, was purged into the test tube 110 for 5 seconds (S202). Afterwards, the test tube 110 was heated to 100° C. (S203), 1-butanol liquid was allowed to flow through the test tube 110, and then, 1-butanol liquid was removed through the trap unit 120 (S204). Next, argon gas was again purged into the test tube 110 for 30 seconds (S205).

Afterwards, a vacuum state was formed in the test tube 110 (S210). The vacuuming of the test tube 110 includes two sub-steps (S206 and S207), that is, the first vacuum state was formed by operating the second rotary pump 154 (S206) and the second vacuum state, which is a vacuum state higher than the first vacuum state, was formed by operating the TMP 140 after a predetermined time period from the first vacuum state has elapsed (S207). In the process of forming the first and second vacuum states, the pressure in the test tube 110 was measured using the pressure gauge 130 (S220).

As a result, a pressure profile according to time was obtained as shown in FIG. 5. More specifically, when the first vacuum state was formed, the pressure profile according to Embodiment 1 does not sufficiently converge to the reference pressure profile due to the partial pressure of water vapor formed by detaching or separating water molecules from the inner surface of the test tube 110, which had been adsorbed or bonded to the inner surface of the test tube 110. However, it is seen that the pressure profile according to Embodiment 1 rapidly converges to the reference pressure profile as the second vacuum state was formed, denoting that almost no water molecules that had adsorbed to the inner surface of the test tube 110 were left on the inner surface of the test tube 110.

Accordingly, it is observed that most of the water molecules adsorbed or bonded to the inner surface of the test tube 110 were removed by 1-butanol.

Embodiment 2

Except for the use of 1-pentanol instead of 1-butanol, the test of the water-removing effect according to Embodiment 2 was performed utilizing the same procedure as in Embodiment 1, and the results are shown in FIG. 5.

Referring to FIG. 5, in the case of using 1-pentanol, the water-removing effect was stronger than the case of using 1-butanol in the second vacuum region.

Embodiment 3

Figure 6:
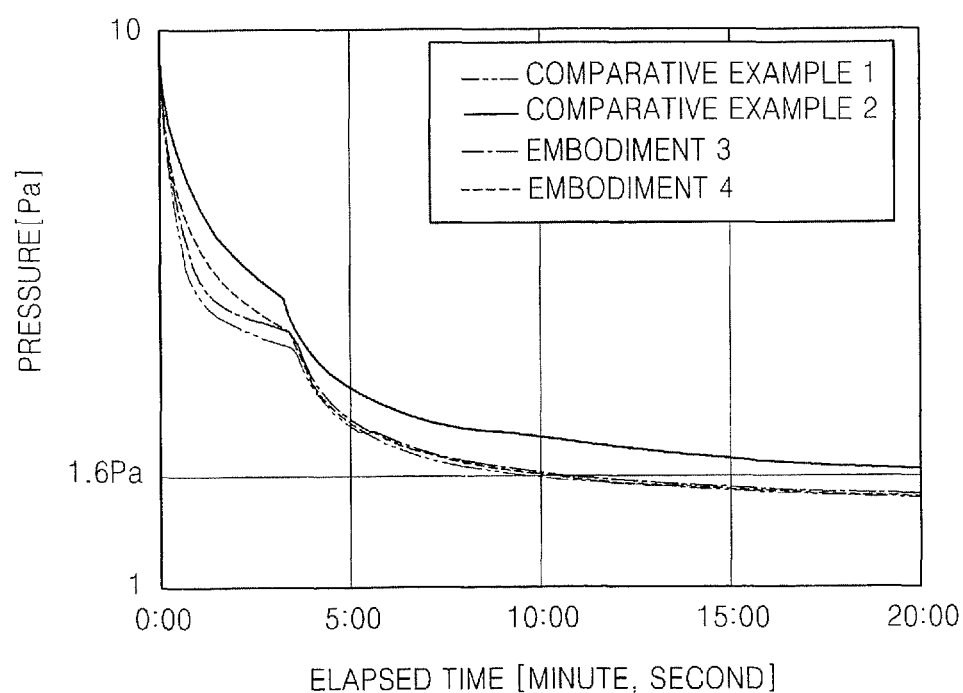

Except for the use of isopropyl alcohol (IPA) instead of 1-butanol, the test of the water-removing effect according to Embodiment 3 was performed utilizing the same procedure as in Embodiment 1, and the results are shown in FIG. 6.

Referring to FIG. 6, in the case of using IPA, a very strong water-removing effect was shown in the second vacuum region.

Embodiment 4

Except for the use of ethanol instead of 1-butanol, the test of the water-removing effect according to Embodiment 4 was performed utilizing the same procedure as in Embodiment 1, and the results are shown in FIG. 6.

Referring to FIG. 6, in the case of using ethanol, a very strong water-removing effect was shown in the second vacuum region.

Embodiment 5

Figure 7:
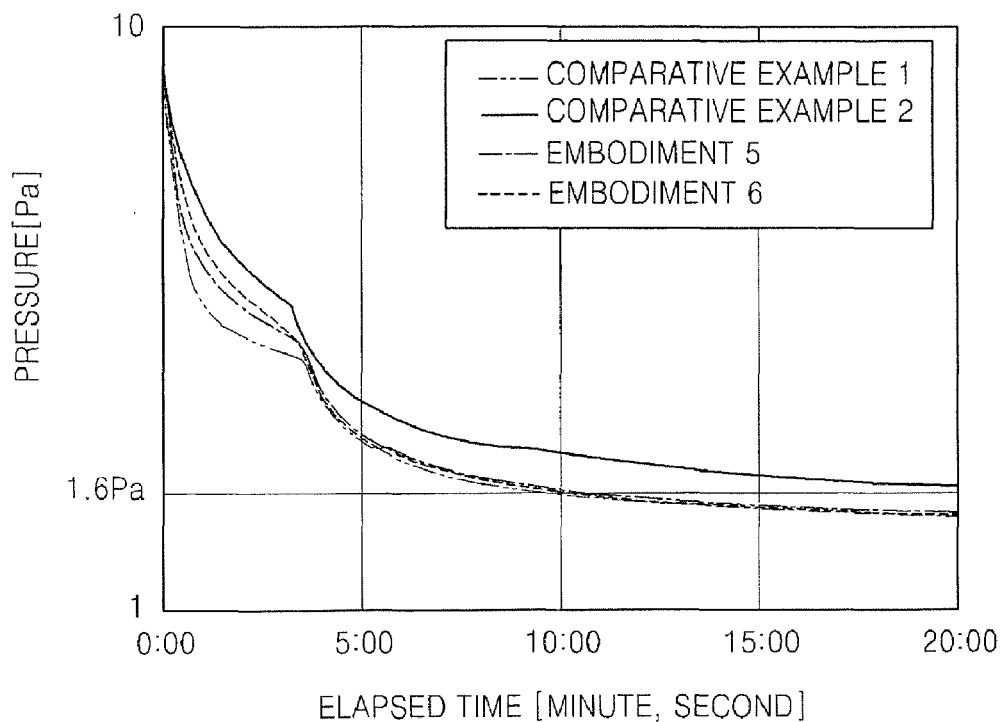

Except for the use of N-methyl-2-pyrrolidone (NMP) instead of 1-butanol, the test of the water-removing effect according to Embodiment 5 was performed utilizing the same procedure as in Embodiment 1, and the results are shown in FIG. 7.

Referring to FIG. 7, in the case of using NMP, a very strong water-removing effect was shown in the second vacuum region.

Embodiment 6

Except for the use of dimethylketone instead of 1-butanol, the test of the water-removing effect according to Embodiment 6 was performed utilizing the same procedure as in Embodiment 1, and the results are shown in FIG. 7.

Referring to FIG. 7, in the case of using dimethylketone, a very strong water-removing effect was shown in the second vacuum region.

Embodiment 7

Figure 8:
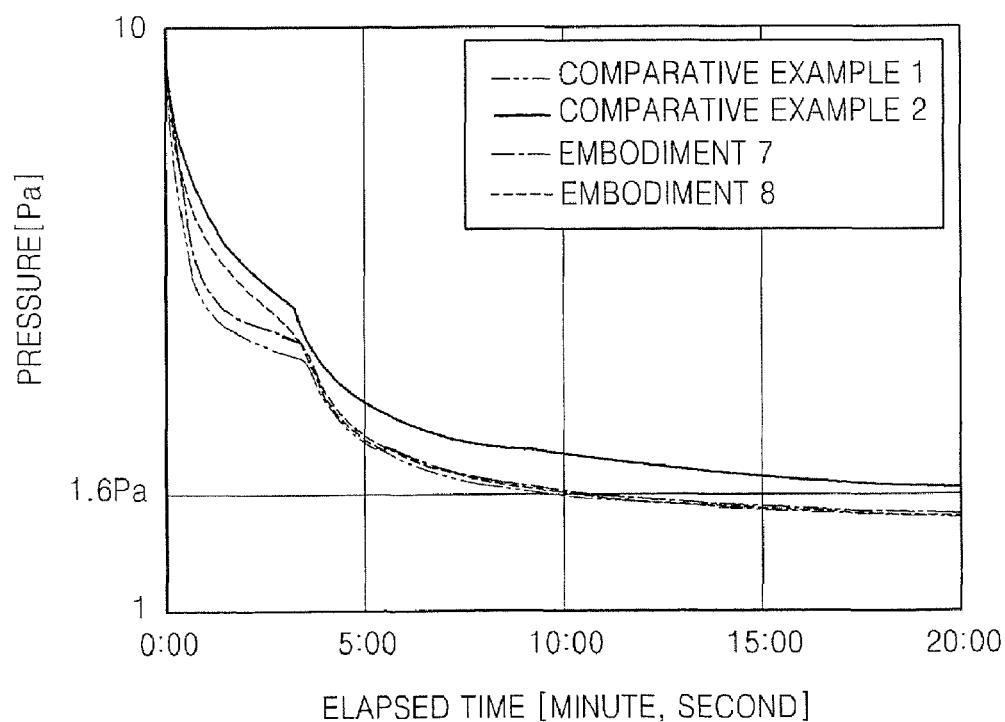

Except for the use of dimethylether instead of 1-butanol, the test of the water-removing effect according to Embodiment 7 was performed utilizing the same procedure as in Embodiment 1, and the results are shown in FIG. 8.

Referring to FIG. 8, in the case of using dimethylether, a very strong water-removing effect was shown in the second vacuum region.

Embodiment 8

Except for the use of trimethylamine instead of 1-butanol, the test of the water-removing effect according to Embodiment 8 was performed utilizing the same procedure as in Embodiment 1, and the results are shown in FIG. 8.

Referring to FIG. 8, in the case of using trimethylamine, a very strong water-removing effect was shown in the second vacuum region.

Embodiment 9

Figure 9:
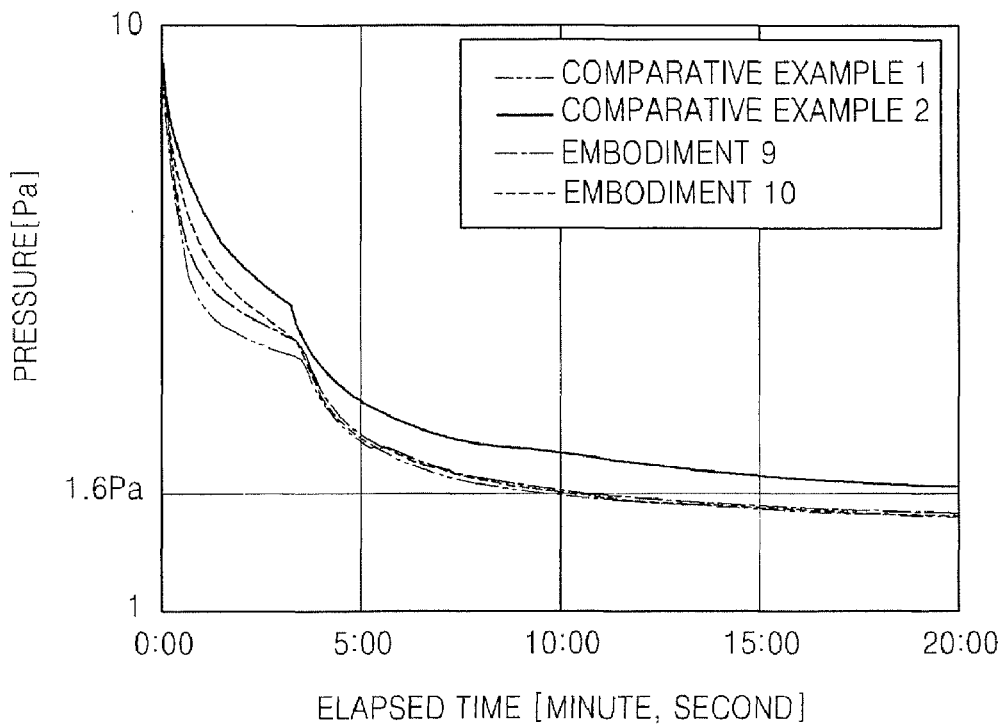

Except for the use of ethylene oxide instead of 1-butanol, the test of the water-removing effect according to Embodiment 9 was performed utilizing the same procedure as in Embodiment 1, and the results are shown in FIG. 9.

Referring to FIG. 9, in the case of using ethylene oxide, a very strong water-removing effect was shown in the second vacuum region.

Embodiment 10

Except for the use of 2-butanal instead of 1-butanol, the test of the water-removing effect according to Embodiment 10 was performed utilizing the same procedure as in Embodiment 1, and the results are shown in FIG. 9.

Figure 10:
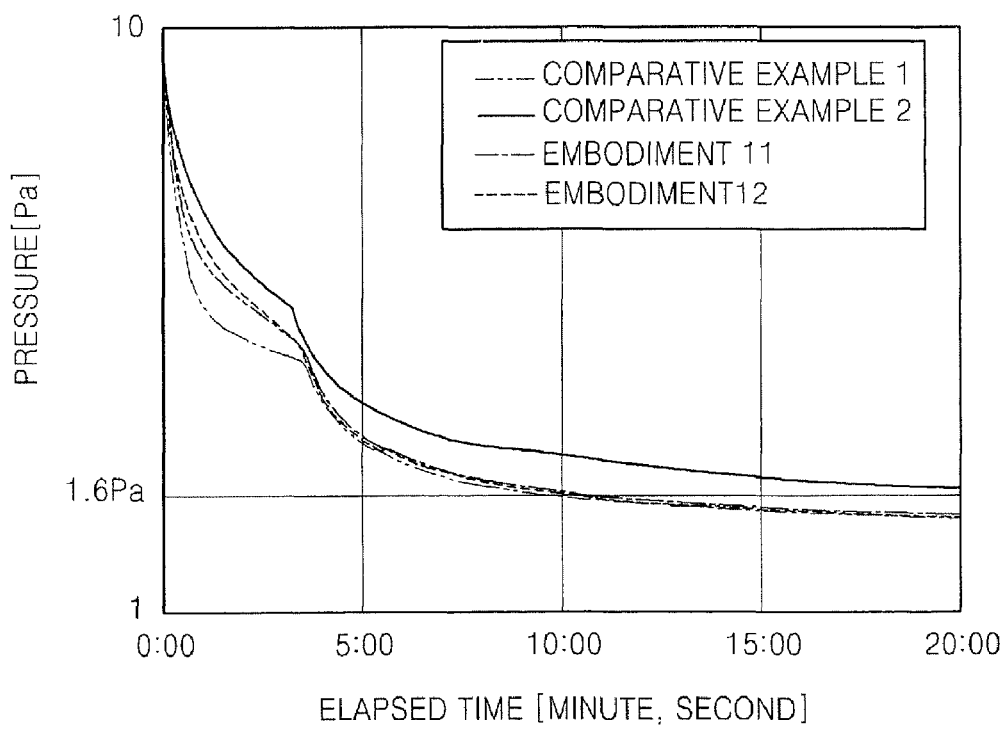

Referring to FIG. 10, in the case of using 2-butanal, a very strong water-removing effect was shown in the second vacuum region.

Embodiment 11

Except for the use of diisobutylamine instead of 1-butanol, the test of the water-removing effect according to Embodiment 11 was performed utilizing the same procedure as in Embodiment 1, and the results are shown in FIG. 10.

Referring to FIG. 10, in the case of using diisobutylamine, a very strong water-removing effect was shown in the second vacuum region.

Embodiment 12

Except for the use of pyrrolidine instead of 1-butanol, the test of the water-removing effect according to Embodiment 12 was performed utilizing the same procedure as in Embodiment 1, and the results are shown in FIG. 10.

Referring to FIG. 10, in the case of using pyrrolidine, a very strong water-removing effect was shown in the second vacuum region.

While the inventive concept has been particularly shown and described with reference to exemplary embodiments thereof, it will be understood that various changes in form and details may be made therein without departing from the spirit and scope of the following claims.

What is claimed is:

1. A method of removing water adsorbed and/or bonded to a surface of a semiconductor substrate, comprising:
    applying a chemical solvent to the surface of the semiconductor substrate to remove water from the surface of the semiconductor substrate; and
    removing the chemical solvent from the surface of the semiconductor substrate, wherein the application of the chemical solvent to the surface of the semiconductor substrate is performed at a temperature in a range of about 80° C. to about 300° C.

2. The method of claim 1, wherein the chemical solvent is at least one selected from the group consisting of $R^1OH$, $R^2OR^3$, $R^4COR^5$, and $NR^6R^7R^8$, wherein:
    $R^1$, $R^2$, and $R^4$ are respectively independently at least one selected from the group consisting of a C1-C6 alkyl group, a C6-C8 aryl group, a C2-C6 vinyl group, a C2-C6 alkenyl group, a C1-C6 haloalkyl group, a C1-C6 alkoxy group, a C2-C6 alkoxyalkyl group, and an amino group;
    $R^3$, $R^5$, $R^6$, $R^7$, and $R^8$ are respectively independently at least one selected from the group consisting of hydrogen, a halogen group, a C1-C6 alkyl group, a C6-C8 aryl group, a C2-C6 vinyl group, a C2-C6 alkenyl group, a C1-C6 haloalkyl group, a C1-C6 alkoxy group, a C2-C6 alkoxyalkyl group, and an amino group; and
    any two of $R^2$ and $R^3$, $R^4$ and $R^5$, or $R^6$ through $R^8$ form a ring by being connected to each other.

3. The method of claim 1, further comprising purging a gas before and/or after applying the chemical solvent to the surface of the semiconductor substrate.

4. The method of claim 3, wherein the purged gas is at least one selected from the group consisting of He, Ne, Ar, and $N_2$.

5. The method of claim 1, wherein removal of the chemical solvent is performed under an absolute pressure that is lower than atmospheric pressure.

6. The method of claim 1, wherein an attractive force between the chemical solvent and the water is greater than the bonding force or adsorption force between the semiconductor substrate and water.

7. The method of claim 1, wherein the application of the chemical solvent to the surface of the semiconductor substrate is performed at an absolute pressure that is lower than atmospheric pressure.

8. The method of claim 1, wherein the chemical solvent is at least one selected from the group consisting of 1-butanol, 1-pentanol, ethanol, propanol, N-methyl-2-pyrrolidone (NMP), dimethylketone, dimethyl ether, trimethylamine, ethylene oxide, 2-butanal, diisobutylamine, and pyrrolidine.

9. A method of depositing an atomic layer comprising:
    supplying water to a surface of a semiconductor substrate as an oxidant for an atomic layer deposition (ALD) process;

applying a chemical solvent to the surface of the semiconductor substrate; and removing the chemical solvent from the surface of the semiconductor substrate, wherein the application of the chemical solvent to the surface of the semiconductor substrate is performed at a temperature in a range of about 80° C. to about 300° C.

10. The method of claim 9, wherein the chemical solvent is at least one selected from the group consisting of $R^1OH$, $R^2OR^3$, $R^4COR^5$, and $NR^6R^7R^8$, wherein:

$R^1$, $R^2$, and $R^4$ are respectively independently at least one selected from the group consisting of a C1-C6 alkyl group, a C6-C8 aryl group, a C2-C6 vinyl group, a C2-C6 alkenyl group, a C1-C6 haloalkyl group, a C1-C6 alkoxy group, a C2-C6 alkoxyalkyl group, and an amino group;

$R^3$, $R^5$, $R^6$, $R^7$, and $R^8$ are respectively independently at least one selected from the group consisting of hydrogen, a halogen group, a C1-C6 alkyl group, a C6-C8 aryl group, a C2-C6 vinyl group, a C2-C6 alkenyl group, a C1-C6 haloalkyl group, a C1-C6 alkoxy group, a C2-C6 alkoxyalkyl group, and an amino group; and any two of $R^2$ and $R^3$, $R^4$ and $R^5$, or $R^6$ through $R^8$ form a ring by being connected to each other.

* * * * *